(12) United States Patent
Lin et al.

(10) Patent No.: US 9,049,790 B2
(45) Date of Patent: Jun. 2, 2015

(54) MASKING LAYER FORMED BY APPLYING DEVELOPABLE PHOTOSENSITIVE RESIN COMPOSITIONS ON PANEL STRUCTURE

(71) Applicant: eChem Solutions Corp., Taoyuan (TW)

(72) Inventors: Shih-Peng Lin, Taoyuan (TW); Yu-cheng Lai, Taoyuan (TW); Hsin-Jen Cheng, Taoyuan (TW); Yan-fu Pan, Taoyuan (TW); Yi-Lun Chiu, Taoyuan (TW); Tsung-Mu Yang, Taoyuan (TW); Chen-Wen Chiu, Taoyuan (TW); Chia-Ling Luo, Taoyuan (TW)

(73) Assignee: ECHEM SOLUTIONS CORP., Taoyuan (TW)

( * ) Notice: Subject to any disclaimer, the term of this patent is extended or adjusted under 35 U.S.C. 154(b) by 170 days.

(21) Appl. No.: 13/965,436

(22) Filed: Aug. 13, 2013

(65) Prior Publication Data

US 2015/0047881 A1 Feb. 19, 2015

(51) Int. Cl.
*H05K 1/02* (2006.01)
*G03F 7/00* (2006.01)
*G03F 7/004* (2006.01)

(52) U.S. Cl.
CPC ............ *H05K 1/0296* (2013.01); *G03F 7/0005* (2013.01); *G03F 7/004* (2013.01)

(58) Field of Classification Search
CPC ........ G03F 7/0005; G03F 7/004; G03F 7/027
See application file for complete search history.

(56) References Cited

U.S. PATENT DOCUMENTS

| 4,272,594 | A | * | 6/1981 | George et al. .................... 430/14 |
| 5,095,379 | A | * | 3/1992 | Fukunaga et al. ............. 349/192 |
| 2001/0046010 | A1 | * | 11/2001 | Kamijyo et al. ............... 349/112 |
| 2005/0179368 | A1 | * | 8/2005 | Ryu et al. ........................ 313/504 |
| 2011/0070532 | A1 | * | 3/2011 | Ikeda et al. ......................... 430/5 |
| 2011/0200810 | A1 | * | 8/2011 | Kubota .......................... 428/220 |
| 2011/0250713 | A1 | * | 10/2011 | Kawasaki ........................ 438/34 |
| 2011/0294051 | A1 | * | 12/2011 | Sultemeyer et al. .............. 430/7 |
| 2013/0029271 | A1 | * | 1/2013 | Lee ............................. 430/288.1 |
| 2014/0051238 | A1 | * | 2/2014 | Saitoh ............................ 438/510 |
| 2014/0054145 | A1 | * | 2/2014 | Chi et al. ........................ 200/304 |
| 2014/0099766 | A1 | * | 4/2014 | Saitoh ............................. 438/286 |
| 2014/0234774 | A1 | * | 8/2014 | Cho et al. .................... 430/281.1 |

FOREIGN PATENT DOCUMENTS

CN 102621811 A * 8/2012

* cited by examiner

*Primary Examiner* — Mark Ruthkosky
*Assistant Examiner* — Christopher Polley
(74) *Attorney, Agent, or Firm* — Jackson IPG PLLC; Demian K. Jackson

(57) ABSTRACT

The invention relates to a masking layer. The masking layer produced by coating a white-color photosensitive resin composition on a peripheral region of a transparent substrate, developing the white-color photosensitive resin composition to obtain a patterned composition layer, coating a gray-color photosensitive resin composition on the cured composition layer and developing the gray-color photosensitive resin composition, so that the gray-color photosensitive resin composition is cured to obtain the masking layer having an optical density (O.D.) of ≥3.5. The masking layer is adapted for use on a touch panel or a flat panel display device. The masking layer shows a white color appearance when viewed from outside and serves as a white color decoration around the peripheral region of the device. The masking layer further comprises a gray colored sub-layer to mask the electrical circuitry disposed beneath the masking layer.

19 Claims, 2 Drawing Sheets

MASKING LAYER FORMED BY APPLYING DEVELOPABLE PHOTOSENSITIVE RESIN COMPOSITIONS ON PANEL STRUCTURE

BACKGROUND OF THE INVENTION

1. Field of the Invention

The present invention relates to a masking layer made from developable photosensitive resin compositions and adapted for use on a touch panel device, a flat panel display device or a like device. As compared to the conventional masking layers that should be of a darkish color or even a black color, the invention advantageously imparts the device to which the invention is applied with higher versatility in color appearance, while comprising a gray colored sub-layer to effectively maintain or even improve the masking property.

2. Description of the Prior Art

Touch panels have been widely used in a broad variety of consumer electronic products, including mobile phones, digital cameras and satellite navigation devices, as a means to constitute a human-machine interface with improved input efficiency. In the actual practice, a touch panel is typically made transparent and mounted in front of the display screen of an electronic product to constitute a touch screen, through which a user can conveniently perform interactive input operations with respect to the information presented on the display screen. This technology remarkably improves the user friendliness of the human-machine interface. A typical touch panel architecture includes a touch sensing member mounted between a top plate and a substrate, and an electric circuitry disposed on the periphery thereof for transmitting touch signals received by the touch sensing member to a signal processing circuit. A conventional process for mounting a touch panel onto a display screen of an electronic product comprises fitting the periphery of the touch panel into a frame and then fixing the resultant frame structure to the front face of the display screen. In addition to holding the touch panel, the frame used in the architecture of this type serves to protect the electric circuitry mounted on the periphery of the touch panel and improve the overall aesthetic appearance of the touch panel architecture.

However, the conventional touch panel architecture described above has been known to result in several disadvantages. For example, the installation of the frame will inevitably cause unevenness on the outer surfaces of the touch panel architecture, thus deteriorating the smooth appearance of the electronic product.

Another conventional touch panel architecture includes a decorative layer attached onto the inner surface of the top glass plate. The decorative layer is shaped into a frame-like configuration and made of deep-colored non-conductive material with a deep color, so as to mask the electrical circuitry disposed beneath the top glass plate. The process for attaching the decorative layer onto the top glass plate is too complicated to achieve a satisfactory productivity.

A still another conventional touch panel architecture includes a side frame screen-printed along the periphery of the cover glass to mask the electrical circuitry disposed beneath the cover glass. The touch panel of this type, however, is constructed by laminating several thin layers together and is therefore complicated in terms of structure. As shown in FIG. 2, the conventional touch panel comprises a cover glass 40, a shielding side frame 41 disposed on the bottom side of the cover glass 40, a touch control module 50 and a display panel 60, with the respective components being laminated together using an optically clear adhesive 70. This architecture is too complicated to be fabricated in an efficient manner and too thick to meet the design trend of lightweight and slimness.

A so-called one glass solution (OGS) was proposed recently, which incorporates the touch sensor and the cover glass in one layer, resulting in a simplified touch panel architecture. In this architecture, two layers of touch sensing electrodes are arranged in orthogonal directions on the bottom side of the cover glass. As a result, fewer laminating steps are needed for fabricating this architecture and high productivity is optimistically forecasted. The touch panels thus produced have the advantages of lightweight, slimness, low sensing resistance due to using only a single sheet of cover glass, high transparency and high touch sensitivity. Despite so, the OGS technology has not been successfully integrated with the conventional screen-printing process, as the latter has been shown to cause imprecise alignment among the laminated layers, leading to a poor productivity.

SUMMARY OF THE INVENTION

Accordingly, an aspect of the invention is to provide a masking layer made from developable photosensitive resin compositions and adapted for use on a touch panel device, a flat panel display device or a like device, thereby imparting the device with high versatility in color appearance and improving the productivity of the device when using the OGS technology.

In order to achieve the object described above, the masking layer according to the invention is produced by coating a white-color photosensitive resin composition on a peripheral region of one surface of a transparent substrate of a panel structure, developing the white-color photosensitive resin composition to obtain a patterned composition layer, and then coating a gray-color photosensitive resin composition on the cured composition layer and developing the gray-color photosensitive resin composition, so that the gray-color photosensitive resin composition is cured to obtain the masking layer having an optical density (O.D.) of ≥3.5.

The masking layer according to the invention is adapted for use on a touch panel, a flat panel display device or a like device. The masking layer applied on the device shows a white color appearance when viewed from outside and, thus, serves as a white color decoration around the peripheral region of the device. The masking layer further comprises a gray colored sub-layer to effectively mask the electrical circuitry disposed beneath the masking layer.

BRIEF DESCRIPTION OF THE DRAWINGS

The above and other objects, features and effects of the invention will become apparent with reference to the following description of the preferred embodiments taken in conjunction with the accompanying drawing, in which.

DETAILED DESCRIPTION OF THE PREFERRED EMBODIMENTS

Figure 1:
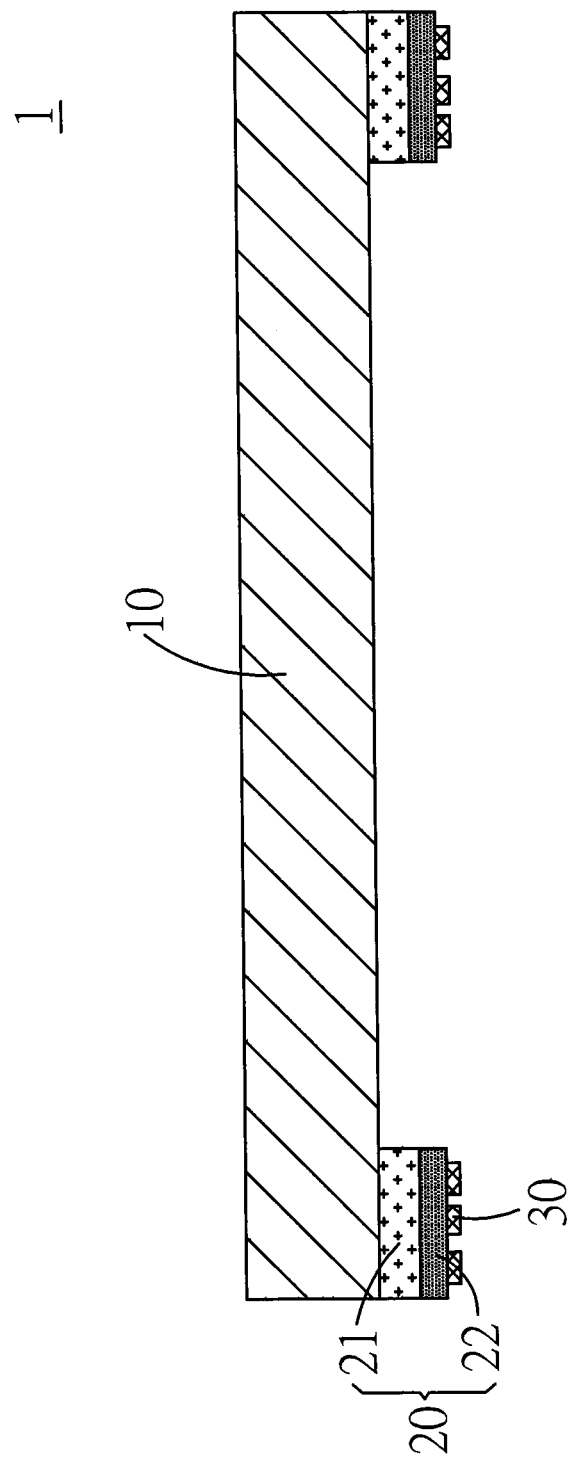
FIG. 1 is a schematic diagram showing the panel structure according to the invention.
Figure 2:
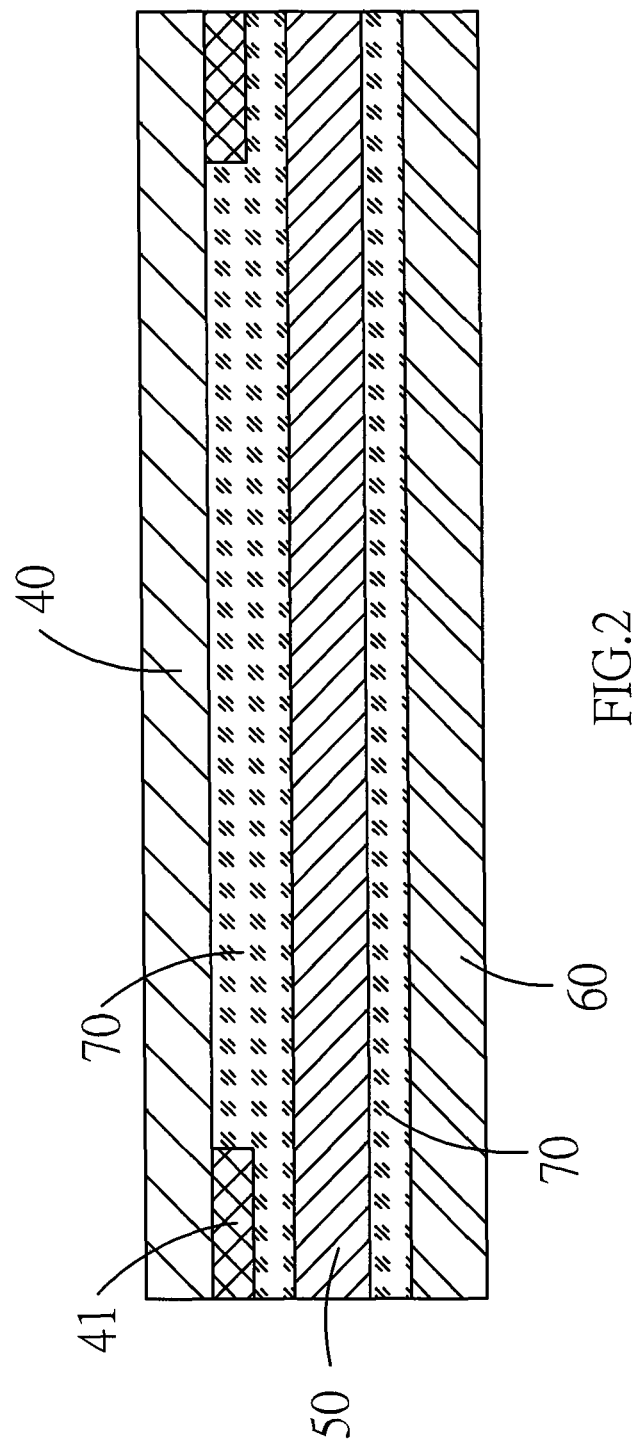
FIG. 2 is a schematic diagram showing a conventional panel structure.

As shown in FIG. 1, the invention is primarily produced by coating a white-color photosensitive resin composition 21 on a peripheral region of one surface of a transparent substrate of a panel structure 1, developing the white-color photosensitive resin composition 21 to obtain a cured composition layer 21, and then coating a gray-color photosensitive resin composition 22 on the cured composition layer 21 and developing the gray-color photosensitive resin composition 22, so that the gray-color photosensitive resin composition 22 is cured and patterned. As a result, the masking layer 20 is formed from the photosensitive resin compositions. An electrical circuitry 30 is disposed under the cured layer of the gray-color photosensitive resin composition 22.

The white-color photosensitive resin composition described herein contains 5~15 wt % of a resin ingredient, from more than 0 wt % to 2 wt % of a photo-initiator, 5~15 wt % of a monomer ingredient, 40~70 wt % of a solvent and 10~30 wt % of a white pigment. The gray-color photosensitive resin composition described herein contains 5~15 wt % of a resin ingredient, from more than 0 wt % to 2 wt % of a photo-initiator, 5~15 wt % of a monomer ingredient, 40~70 wt % of a solvent, 10~30 wt % of a white pigment and from more than 0 wt % to 3 wt % of a black pigment.

The resin ingredient described above may byway of example be a copolymer containing a carboxylic functionality (COOH), which may include but is not limited to an acrylic resin, an acrylic-epoxy resin, an acrylic-melamine resin, an acrylic-styrene resin, a phenolic aldehyde resin or a mixture thereof. Preferably, the resin ingredient has a molecule weight of more than 8000, so as to reduce the precipitation of the white pigment which is known to easily precipitate due to high specific gravity. The molecule weight of the resin ingredient is preferably less than 100,000 Daltons and more preferably ranges from 20,000 to 70,000 Daltons, so as to ensure the operability of the composition.

The photo-initiator is a chemical compound that decomposes into free radicals when exposed to light and preferably has high resolution. The photo-initiator may include, but is not limited to, an oxime ester compound, an acetophenone compound, a propiophenone compound, a butyrophenone compound, a benzophenone compound, a bis-imidazole compound or a mixture thereof.

The monomer ingredient is responsible for the adhesiveness, development and resolution of the photosensitive resin compositions. The monomer ingredient may include, but is not limited to, a multifunctional acrylate monomer, a water-insoluble monomer and a water-soluble monomer. Preferably, the multifunctional acrylate monomer is selected from the group consisting of trimethylpropane triacrylate (TMPTA), tripropylene glycol diacrylate (TPGDA) and 1,6-hexanediol diacrylate (HDDA). The water-insoluble monomer is preferably selected from the group consisting of pentaerythritol triacrylate, trimethylolpropane triacrylate, trimethylolpropane trimethacrylate, Tris(2-hydroxyethyl) isocyanurate triacrylate, (di-trimethylolpropane tetraacrylate, dipentaerythritol pentaacrylate, a pentaacrylate ester, pentaerythritol tetraacrylate, dihexaerythritol hexaacrylate, dipentaerythritol hexaacrylate, a multi-functional monomer, a dendritic/hyper-branched acrylate oligomer, a hyper-branched polyester acrylate and a urethane acrylate. The water-soluble monomer is preferably an ethoxylated monomer or a propoxylated monomer selected from the group consisting of 2(2-ethoxyethoxy) ethyl acrylate, ethoxylated (15)trimethylolpropane triacrylate, ethoxylated (30)bisphenol A diacrylate, ethoxylated(30)bisphenol A dimethacrylate, ethoxylated(20)trimethylolpropane triacrylate, methoxypolyethylene glycol(350)monomethacrylate, methoxy polyethylene glycol(550)monomethacrylate, polyethylene glycol (200)diacrylate, polyethylene glycol(400)diacrylate, polyethylene glycol(400)dimethacrylate, polyethylene glycol(600)diacrylate, polyethylene glycol(600)dimethacrylate and polypropylene glycol monomethacrylate. The monomer ingredient may optionally comprise a co-monomer mixture of the monomers described above.

The white pigment may include but is not limited to titanium dioxide, white lead (lead carbonate), zinc oxide, zinc sulphide, lithopone and antimony oxide. To the white-color photosensitive resin composition, the white pigment is added in an amount of more than 10 wt % based on the total weight of the composition to achieve a satisfactory masking effect. However, the amount of the white pigment added to the white-color photosensitive resin composition should be no more than 65 wt % based on the total weight of the composition, so as to prevent the occurrence of incomplete development. In a preferred embodiment, the white pigment is in an amount from 10 wt % to 30 wt % based on the total weight of the composition. In a preferred embodiment, the white pigment has a particle size of 0.1~5 μm. A particle size of less than 0.1 μm tends to deteriorate the color rendering property of the pigment, whereas a particle size of greater than 5 μm would easily cause the pigment particles to have rough outer surfaces.

The black pigment may include but is not limited to carbon black, titanium black, and a black pigment blend of a red pigment, a green pigment and a blue pigment. In the case of the black pigment blend, the red pigment is added in an amount of 20~50 wt %, the green pigment is added in an amount of 5~40 wt % and the blue pigment is added in an amount of 20~50 wt %, based on the total weight of the pigment blend, wherein the red pigment is preferably selected from Red 254 or Red 177, the green pigment is preferably selected from Green 7, Green 36 or Green 58, and the blue pigment is preferably selected from Blue 156 or Blue 153. In the case where the amount of the black pigment added in the gray-color photosensitive resin composition is elevated to more than 3 wt %, the masking property would be enhanced after curing, but the white-colored appearance exhibited by the cured white-color photosensitive resin composition would tend to be dulled by the background gray color shown by the cured gray-color photosensitive resin composition. As such, the amount of the black pigment added to the gray-color photosensitive resin composition is selected to range from more than 0 wt % to 3 wt %, provided that the resultant making layer has an optical density (O.D.) of ≥3.5, thereby achieving a satisfactory masking effect on the electrical circuitry disposed beneath the making layer without deteriorating the white-colored appearance exhibited by the cured white-color photosensitive resin composition.

The solvent is used to adjust the viscosity of the resin compositions according to the invention. The solvent may include but is not limited to propylene glycol mono-propyl ether acetate, ethylene glycol monopropyl ether, di-ethylene glycol dimethyl ether, tetrahydrofuran, ethylene glycol monomethyl ether, ethylene glycol monoethyl ether, di-ethylene glycol monomethyl ether, di-ethylene glycol monoethyl ether, di-ethylene glycol monobutyl ether, ethyl 3-ethoxy propionate or a mixture thereof. The white-color and gray-color photosensitive resin compositions may be optionally added with an additional additive, such as a surfactant, a leveling agent, an antioxidant and a dispersant. The additive may optionally be a fluoro compound or a siloxane compound. In some preferred embodiments, the white-color photosensitive resin composition contains from more than 0 wt % to 2 wt % of a leveling agent. In some preferred embodiments, the white-color photosensitive resin composition may additionally contain from more than 0 wt % to 2 wt % of an antioxidant to prevent the white pigment from yellowing or quality degradation due to oxidation.

The thin layer cured from the white-color photosensitive resin composition contains the white pigment described above and, therefore, presents a white color appearance. When necessary, the white-color photosensitive resin composition may be added with an additional pigment to achieve a desired color.

For example, the white-color photosensitive resin composition may be added with a blue pigment, such as Blue 156, to achieve a bluish appearance after curing, or added with a green pigment, such as Green 7, to present a greenish color appearance.

The photosensitive resin compositions described herein are adapted for applied to a touch panel, a flat panel display device or a like device. The white-color photosensitive resin composition described herein is first applied onto an upper surface of a transparent substrate through a spin coating process and then subjected, in sequence, to vacuum dry, pre-baking, light exposure, developing and post-baking. Afterwards, the gray-color photosensitive resin composition described herein is applied onto the cured and patterned white-color resin composition layer and processed and patterned in the same manner as those for the white-color photosensitive resin composition. The masking layer is formed accordingly. The transparent substrate includes a lower surface adapted for being attached onto a touch sensing member to constitute a touch panel. According to the touch panel disclosed herein, the masking layer can completely shield and provide protection to the electrical circuitry disposed on the peripheral region of the touch panel while keeping the outer surface of touch panel smooth. As compared to the conventional touch panel products, flat panel display devices and like devices that are limited to be of a darkish color or even black color, the panel structure coated with the masking layer disclosed herein has a higher versatility in color appearance, while comprising a gray colored sub-layer to effectively mask the electrical circuitry disposed beneath the making layer without deteriorating the white-colored appearance exhibited by the cured white-color photosensitive resin composition. Moreover, the invention disclosed herein successfully overcomes the drawbacks that occur in the conventional touch panel architecture produced by the screen-printing process and, thus, can be integrated into the OGS technology to enhance the productivity.

The following examples are given for the purpose of illustration only and are not intended to limit the scope of the invention.

Exemplary embodiments for the white-color and gray-color photosensitive resin compositions are shown in Tables 1 and 2 below.

TABLE 1

White-Color Photosensitive Resin Composition

| | Resin Binder 1 | Photo-initiator OXE-01 | Mono-mer SR399 | Dispersant Efka 5210 | Additive 1 BYK 307 | Additive 2 BYK 302 | White pigment $TiO_2$ | Black pigment Carbon black | Solvent PGMEA |
|---|---|---|---|---|---|---|---|---|---|
| Comparative Example 1 | 9.7 | 0.3 | 8.5 | 0.9 | 0.1 | 0.1 | 22.8 | 0.0 | 57.6 |

TABLE 2

Gray-Color Photosensitive Resin Composition

| | Binder 1 | OXE-01 | SR399 | Efka5210 | BYK307 | BYK302 | $TiO_2$ | Carbon black | PGMEA |
|---|---|---|---|---|---|---|---|---|---|
| Example 1 | 10.5 | 0.3 | 8.0 | 0.9 | 0.1 | 0.0 | 22.0 | 0.3 | 57.9 |
| Example 2 | 9.5 | 0.3 | 8.0 | 0.9 | 0.1 | 0.0 | 23.5 | 1.0 | 56.7 |
| Example 3 | 9.9 | 0.3 | 8.6 | 0.9 | 0.1 | 0.0 | 21.0 | 1.5 | 57.7 |
| Example 4 | 9.8 | 0.5 | 7.5 | 0.9 | 0.1 | 0.0 | 23.0 | 1.7 | 56.5 |
| Example 5 | 9.8 | 0.5 | 8.2 | 0.9 | 0.1 | 0.0 | 22.5 | 1.6 | 56.4 |
| Example 6 | 10.0 | 0.6 | 8.3 | 0.9 | 0.1 | 0.0 | 22.5 | 1.6 | 56.0 |
| Comparative Example 2 | 10.0 | 0.5 | 9.0 | 0.9 | 0.1 | 0.0 | 22.9 | 0.3 | 56.3 |
| Comparative Example 3 | 10.2 | 0.5 | 9.8 | 0.9 | 0.1 | 0.0 | 21.5 | 1.0 | 56.0 |
| Comparative Example 4 | 9.8 | 0.5 | 9.0 | 0.9 | 0.1 | 0.0 | 20.8 | 1.7 | 57.2 |
| Comparative Example 5 | 10.0 | 0.8 | 9.7 | 0.9 | 0.1 | 0.0 | 17.5 | 3.5 | 57.5 |

Remarks:

1. The black pigment used in Examples 1~3 and Comparative Example 5 is a pigment blend of 37.7% Green 36, 34.3% Red 177 and 28.0% Blue 156.

2. The black pigment used in Example 4 is a pigment blend of 40.0% Green 36, 20% Red 177 and 40.0% Blue 153. The black pigment used in Example 5 is a pigment blend of 45.0% Green 36, 10% Red 177 and 45.0% Blue 153. The black pigment used in Example 6 is a pigment blend of 47.5% Green 36, 5% Red 177 and 47.5% Blue 153.

3. The black pigment used in Comparative Examples 2~4 is carbon black.

4. The white-color photosensitive resin composition is applied to have a thickness of 10 whereas the thickness of the gray-color photosensitive resin compositions is 3 µm.

5. The resin Binder 1 was synthesized according to the following process. 75 g of benzyl methacrylate, 55 g of glycidyl methacrylate, 25 g of methyl methacrylate, 10 g of styrene and 280 g of propylene glycol mono-ethyl acetate as a solvent were mixed using a mechanical stirrer in a reactor under a nitrogen atmosphere for 30 min. The reactor was heated to 70° C. under a nitrogen atmosphere. When the temperature of the mixture reached 70° C., 2.9 g of azobisisobutyronitrile (AIBN) as a thermal polymerization initiator was introduced into the reactor. The mixture was stirred for 8 hr to give a polymer. Then, the reactor was heated to 80° C. Stirring was continued for 30 min to complete the synthesis of a desired acrylic resin.

Irgacure OXE-01 is an oxime ester photo-initiator commercially available from Ciba Specialty Chemicals. SR399 is a monomer Dipentaerythritol pentaacrylate from Sartomer, Ltd. Efka5210 is a dispersing agent for inorganic pigment manufactured by BASF. The additive BYK307 is a leveling agent commercially available silicon surface modifier manufactured by BYK-Chemie GmbH. The additive BYK302 is a commercially available silicon surface modifier manufactured by BYK-Chemie GmbH. The solvent PGMEA is an abbreviation of propylene glycol monomethyl ether acetate, which was purchased from DOW Chemical Company.

The resin compositions are subjected to the tests below.

1. Test for Developability

The white-color and gray-color photosensitive resin compositions are each spin coated onto a substrate as described above, subjected to vacuum dry and pre-baking at 100° C. for 3 minutes and then exposed to light via a photo-mask having a pattern corresponding to a side frame of a smart phone and developed in a basic developer solution (0.045% KOH). The developed resin layers are evaluated respectively and denoted either by the symbol "○" if no significant undeveloped residues are observed or by the symbol "Δ" if significant undeveloped residues are observed.

2. Test for Reactivity

The film thicknesses of the respective resin layers are measured before and after they are developed. Reactivity is calculated according to the following equation.

$$\text{Reactivity} = \frac{\text{Film thickness after development}}{\text{Film thickness before development}} \times 100\%$$

The calculated values are graded into three levels, where:

⊚ represents >98%;

○ represents 95~98%; and

Δ represents 85~95%.

The test results of the respective Examples and Comparative Examples are shown in Table 3 below.

TABLE 3

| | Test Results | |
|---|---|---|
| | Developability | Reactivity |
| Example 1 | ○ | ⊚ |
| Example 2 | ○ | ⊚ |
| Example 3 | ○ | ○ |
| Example 4 | ○ | ⊚ |
| Example 5 | ○ | ⊚ |
| Example 6 | ○ | ⊚ |
| Comparative Example 1 | ○ | ⊚ |
| Comparative Example 2 | ○ | ○ |
| Comparative Example 3 | ○ | ○ |
| Comparative Example 4 | ○ | ○ |
| Comparative Example 5 | Δ | Δ |

As shown in Table 3, the test results for developability indicate that, except for Comparative Example 5 which contains the highest amount of carbon black, all of the compositions under test were proved to be well-developed in photolithography and contain no significant amount of undeveloped residues. In the reactivity test, Comparative Example 5 again received the worst grade. The results shown in Table 3 indicate that Examples 1, 2, 4~6 and Comparative Example 1 exhibit the greatest photolithographic property. While Example 3 and Comparative Examples 2~4 only show a medium level of reactivity, the overall performance thereof is significantly superior to that of Comparative Example 5.

The resin layers formed with various thicknesses from the white-color photosensitive resin composition were combined with the resin layers formed with various thicknesses from the gray-color photosensitive resin compositions. The resultant masking layers were tested for chromatic characteristics and masking effect and the results were shown in Table 4 below.

TABLE 4

| | Thickness of film formed from white composition (µm) | Thickness of film formed from gray composition (µm) | O.D. | b1* | b2* | Δb* |
|---|---|---|---|---|---|---|
| Example 7 (Compar. Example 1 in combination with Example 3) | 5 | 1 | 3.84 | −0.62 | 0.10 | 0.72 |
| | 7 | 1 | 3.92 | −0.36 | 0.34 | 0.70 |
| | 10 | 0.5 | 3.75 | −0.41 | 0.27 | 0.68 |
| | 10 | 1 | 4.02 | −0.30 | 0.41 | 0.71 |
| | 10 | 1.5 | 4.25 | −0.15 | 0.57 | 0.72 |
| | 15 | 1 | 4.28 | −0.02 | 0.66 | 0.68 |

TABLE 4-continued

| | Thickness of film formed from white composition (μm) | Thickness of film formed from gray composition (μm) | O.D. | b1* | b2* | Δb* |
|---|---|---|---|---|---|---|
| Example 8 (Compar. Example 1 in combination with Example 4) | 10 | 1 | 3.87 | −2.83 | −1.82 | 1.01 |
| Example 9 (Compar. Example 1 in combination with Example 5) | 10 | 1 | 3.52 | −2.59 | −1.57 | 1.02 |
| Example 10 (Compar. Example 1 in combination with Example 6) | 10 | 1 | 3.51 | −2.54 | −1.67 | 0.87 |
| Example 11 (Compar. Example 1 in combination with Compar. Example 4) | 10 | 1 | 3.71 | −1.97 | −1.24 | 0.73 |
| Comparative Example 1 | 5 | 0 | 2.64 | −0.61 | 0.11 | 0.72 |
| | 7 | 0 | 2.75 | −0.57 | 0.12 | 0.69 |
| | 10 | 0 | 2.85 | −0.58 | 0.11 | 0.69 |
| | 15 | 0 | 3.23 | −0.37 | 0.34 | 0.71 |

Remarks:
1. Optical Density (O.D.) and chromaticity values represented by the parameter b1*, b2* were measured using a colorimeter (MCPD-3000, Otsuka Electronics Co. Ltd.) under dark condition.
2. The parameter b1* represents the chromaticity measured after performing post-baking at 220° C. for 20 minutes.
3. The parameter b2* represents the chromaticity measured after performing post-baking at 230° C. for 120 minutes.
4. Δb* = b2* − b1*.

The results shown in Table 4 indicate that Examples 7~11 and Comparative Example 1 exhibit a Δb* of ≤2.0 even experiencing a prolonged period of baking and, thus, meet the chromaticity requirement. However, Comparative Example 1 contains only the white-color photosensitive resin composition and fails to meet the O.D. requirement of ≥3.5 at the highest film thickness. In contrast, when Comparative Example 1 is combined with the gray-color photosensitive resin compositions of Examples 3~6 or Comparative Example 4, the resultant masking layers can easily meet the requirement for O.D.≥3.5 at a lower film thickness and demonstrate excellent masking effect.

In conclusion, the masking layer disclosed herein can surely achieve the intended objects and effects of the invention by virtue of the structural arrangement described above. While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit of the invention and the scope thereof as defined in the appended claims.

What is claimed is:

1. A masking layer produced by coating a white-color photosensitive resin composition on a peripheral region of a surface of a transparent substrate of a panel structure, developing the white-color photosensitive resin composition to obtain a cured and patterned composition layer, and then coating a gray-color photosensitive resin composition on the patterned composition layer and developing the gray-color photosensitive resin composition, so that the gray-color photosensitive resin composition is cured and patterned to obtain the masking layer having an optical density (O.D.) of ≥3.5, wherein:

the white-color photosensitive resin composition comprises 5~15 wt % of a resin ingredient, from more than 0 wt % to 2 wt % of a photo-initiator, 5~15 wt % of a monomer ingredient, 40~70 wt % of a solvent and 10~30 wt % of a white pigment; and the gray-color photosensitive resin composition comprises 5~15 wt % of a resin ingredient, from more than 0 wt % to 2 wt % of a photo-initiator, 5~15 wt % of a monomer ingredient, 40~70 wt % of a solvent, 10~30 wt % of a white pigment and from more than 0 wt % to 3 wt % of a black pigment.

2. The masking layer according to claim 1, wherein the resin ingredient is selected from the group consisting of an acrylic resin, an acrylic-epoxy resin, an acrylic-melamine resin, an acrylic-styrene resin, a phenolic aldehyde resin and a mixture thereof.

3. The masking layer according to claim 1, wherein the resin ingredient comprises acrylic functionality.

4. The masking layer according to claim 1, wherein the photo-initiator is selected from the group consisting of an oxime ester, an acetophenone, a propiophenone compound, a butyrophenone compound, a benzophenone, a bis-imidazole and a mixture thereof.

5. The masking layer according to claim 1, wherein the monomer ingredient is selected from the group consisting of a multifunctional acrylate monomer, a water-insoluble monomer, a water-soluble monomer and a co-monomer mixture of the monomers, wherein the multifunctional acrylate monomer is selected from the group consisting of trimethylpropanetriacrylate (TMPTA), tripropyleneglycol diacrylate (TPGDA) and 1,6-hexanedioldiacrylate (HDDA), wherein the water-insoluble monomer is selected from the group consisting of pentaerythritol triacrylate, trimethylolpropane triacrylate, trimethylolpropane trimethacrylate, Tris(2-hydroxyethyl) isocyanurate triacrylate, (di-trimethylolpropane tetraacrylate, dipentaerythritol pentaacrylate, a pentaacrylate ester, pentaerythritol tetraacrylate, dihexaerythritol hexaacrylate, dipentaerythritol hexaacrylate, a multi-functional monomer, a dendritic/hyper-branched acrylate oligomer, a hyper-branched polyester acrylate and a urethane acrylate, and wherein the water-soluble monomer is an ethoxylated monomer or a propoxylated monomer selected from the group consisting of 2(2-ethoxyethoxy)ethyl acrylate, ethoxylated (15)trimethylolpropane triacrylate, ethoxylated (30)bisphenol A diacrylate, ethoxylated(30)bisphenol A dimethacrylate, ethoxylated(20)trimethylolpropane triacrylate, methoxy polyethylene glycol(350)monomethacrylate, methoxy polyethylene glycol(550)monomethacrylate, polyethylene glycol(200)diacrylate, polyethylene glycol(400) diacrylate, polyethylene glycol(400)dimethacrylate, polyethylene glycol(600)diacrylate, polyethylene glycol(600) dimethacrylate and polypropylene glycol monomethacrylate.

6. The masking layer according to claim 1, wherein the solvent is selected from the group consisting of propylene glycol mono-propyl ether acetate, ethylene glycol monopropyl ether, di-ethylene glycol dimethyl ether, tetrahydrofuran, ethylene glycol monomethyl ether, ethylene glycol monoethyl ether, di-ethylene glycol monomethyl ether, di-ethylene glycol monoethyl ether, di-ethylene glycol monobutyl ether, ethyl 3-ethoxy propionate and a mixture thereof.

7. The masking layer according to claim 1, wherein the white-color photosensitive resin composition and gray-color photosensitive resin composition further comprise at least one additive.

8. The masking layer according to claim 7, wherein the additive is selected from the group consisting of a fluoro compound or a siloxane compound.

9. The masking layer according to claim 7, wherein the white-color photosensitive resin composition comprises from more than 0 wt % to 2 wt % of a leveling agent and from more than 0 wt % to 2 wt % of an antioxidant.

10. The masking layer according to claim 1, wherein the pigment is selected from the group consisting of titanium dioxide, white lead (lead carbonate), zinc oxide, zinc sulphide, lithopone and antimony oxide.

11. The masking layer according to claim 1, wherein the white-color photosensitive resin composition further comprises an additional pigment other than the white pigment.

12. The masking layer according to claim 1, wherein the black pigment is selected from the group consisting of carbon black, titanium black and a black pigment blend of a red pigment, a green pigment and a blue pigment.

13. The masking layer according to claim 11, wherein the red pigment is in an amount of 20~50 wt %, the green pigment is in an amount of 5~40 wt % and the blue pigment is in an amount of 20~50 wt %, based on the total weight of the black pigment blend.

14. The masking layer according to claim 11, wherein the red pigment is selected from the group consisting of Red 254 and Red 177, the green pigment is selected from the group consisting of Green 7, Green 36 and Green 58, and the blue pigment is selected from the group consisting of Blue 156 and Blue 153.

15. The masking layer according to claim 1, wherein an electrical circuitry is disposed beneath the masking layer, so that the electrical circuitry is masked by the gray-color photosensitive resin composition.

16. The masking layer according to claim 1, wherein the resin ingredient has a molecule weight of from 8000 to 100,000 Daltons.

17. The masking layer according to claim 15, wherein the resin ingredient has a molecule weight of from 20,000 to 70,000 Daltons.

18. The masking layer according to claim 1, wherein the cured composition layer formed from the white-color photosensitive resin composition has a thickness of 5~20 µm, and the cured composition layer formed from the gray-color photosensitive resin composition has a thickness of 1~5 µm.

19. The masking layer according to claim 1, wherein the masking layer has a $\Delta b^*$ of $\leq 2.0$, where the $\Delta b^*$ represents the difference between the chromaticity values measured under two different post-baking conditions.

* * * * *